US009429973B2

(12) United States Patent
Kim et al.

(10) Patent No.: US 9,429,973 B2
(45) Date of Patent: Aug. 30, 2016

(54) POWER CONTROL SYSTEM WITH PERFORMANCE MONITORING

(71) Applicant: Broadcom Corporation, Irvine, CA (US)

(72) Inventors: Neil Y. Kim, Laguna Niguel, CA (US); Pieter Vorenkamp, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/143,354

(22) Filed: Dec. 30, 2013

(65) Prior Publication Data

US 2014/0111272 A1   Apr. 24, 2014

Related U.S. Application Data

(63) Continuation of application No. 13/735,004, filed on Jan. 6, 2013, now Pat. No. 8,639,473, which is a continuation of application No. 13/358,804, filed on Jan. 26, 2012, now Pat. No. 8,352,217, which is a (Continued)

(51) Int. Cl.
  *G06F 19/00*   (2011.01)
  *G05F 1/66*    (2006.01)
  (Continued)

(52) U.S. Cl.
  CPC .............. *G05F 1/66* (2013.01); *G01K 13/00* (2013.01); *G01R 31/28* (2013.01); *G06F 17/00* (2013.01);
  (Continued)

(58) Field of Classification Search
  CPC ..... G06F 13/14; G06F 3/0484; G06F 3/0488

USPC ................................................ 702/182–185
  See application file for complete search history.

(56) References Cited

U.S. PATENT DOCUMENTS 5,283,905 A * 2/1994 Saadeh ..................... G06F 1/28
                                                   713/324
5,799,198 A * 8/1998 Fung ..................... G06F 1/3203
                                                     712/1

(Continued)

FOREIGN PATENT DOCUMENTS

CN            1153563 A     7/1997
CN            1427319 A     7/2003
WO   WO 2004/031488 A2     4/2004

OTHER PUBLICATIONS

Anonymous, "Integrated Voltage Regulator for an On-Card +1.7 Volt Power Supply," IBM Technical Disclosure Bulletin, New York, USA, vol. 31, No. 2, Jul. 1, 1988, XP002344799; pp. 22-23.

(Continued)

*Primary Examiner* — Edward Raymond
(74) *Attorney, Agent, or Firm* — Sterne, Kessler, Goldstein & Fox PLLC

(57) ABSTRACT

A system and method for controlling performance and/or power based on monitored performance characteristics. Various aspects of the present invention may comprise an integrated circuit comprising a first circuit module that receives electrical power. A second circuit module may monitor one or more performance characteristics of the first circuit module and/or the integrated circuit. A third circuit module may, for example, determine power control information based at least in part on the monitored performance characteristic(s). The power control information may be communicated to power supply circuitry to control various characteristics of the electrical power. Various aspects of the present invention may also comprise an integrated circuit comprising a first module that monitors at least one performance characteristic of a first electrical device. The integrated circuit may also comprise modules that determine power control information based on the monitored performance characteristic(s) and communicate such power control information to power supply circuitry.

23 Claims, 8 Drawing Sheets

Related U.S. Application Data continuation of application No. 12/950,762, filed on Nov. 19, 2010, now Pat. No. 8,108,181, which is a continuation of application No. 12/185,216, filed on Aug. 4, 2008, now Pat. No. 7,840,379, which is a continuation of application No. 11/158,176, filed on Jun. 21, 2005, now Pat. No. 7,409,315.

(60) Provisional application No. 60/583,913, filed on Jun. 28, 2004.

(51) Int. Cl.
| | | |
|---|---|---|
| *H02J 13/00* | (2006.01) | |
| *G01K 13/00* | (2006.01) | |
| *G01R 31/28* | (2006.01) | |
| *G06F 17/00* | (2006.01) | |
| *G06F 11/34* | (2006.01) | |

(52) U.S. Cl.
CPC ........ *H02J 13/0003* (2013.01); *G06F 11/3409* (2013.01); *Y02B 60/165* (2013.01); *Y02B 90/228* (2013.01); *Y04S 20/18* (2013.01)

(56) References Cited

U.S. PATENT DOCUMENTS

| | | | |
|---|---|---|---|
| 5,940,785 | A | 8/1999 | Georgiou et al. |
| 5,969,625 | A * | 10/1999 | Russo ...................... 340/636.19 |
| 6,021,500 | A | 2/2000 | Wang |
| 6,047,248 | A | 4/2000 | Georgiou et al. |
| 6,243,656 | B1 | 6/2001 | Arai et al. |
| 6,289,467 | B1 | 9/2001 | Lewis et al. |
| 6,356,057 | B1 | 3/2002 | Shilo et al. |
| 6,363,490 | B1 | 3/2002 | Senyk |
| 6,507,169 | B1 * | 1/2003 | Holtom et al. ............... 320/106 |
| 6,594,771 | B1 | 7/2003 | Koerber et al. |
| 6,647,328 | B2 | 11/2003 | Walker |
| 6,651,178 | B1 | 11/2003 | Voegeli et al. |
| 7,013,084 | B2 | 3/2006 | Battou et al. |
| 7,274,332 | B1 | 9/2007 | Dupray |
| 7,409,315 | B2 | 8/2008 | Kim et al. |
| 7,840,379 | B2 | 11/2010 | Kim et al. |
| 8,108,181 | B2 | 1/2012 | Kim et al. |
| 8,352,217 | B2 | 1/2013 | Kim et al. |
| 8,639,473 | B2 | 1/2014 | Kim et al. |
| 2003/0131269 | A1 | 7/2003 | Mizyuabu et al. |
| 2004/0064290 | A1 | 4/2004 | Cabral et al. |
| 2004/0090219 | A1 | 5/2004 | Chapuis |
| 2004/0123164 | A1 | 6/2004 | Chapuis et al. |
| 2004/0225821 | A1 | 11/2004 | Klein et al. |
| 2004/0268278 | A1 | 12/2004 | Hoberman et al. |
| 2005/0289489 | A1 | 12/2005 | Kim et al. |
| 2006/0052958 | A1 | 3/2006 | Hancock et al. |
| 2006/0052962 | A1 | 3/2006 | Shipton et al. |
| 2008/0294379 | A1 | 11/2008 | Kim et al. |
| 2009/0144568 | A1 | 6/2009 | Fung |
| 2009/0164812 | A1 * | 6/2009 | Capps et al. .................. 713/320 |
| 2011/0063020 | A1 | 3/2011 | Kim et al. |
| 2012/0126779 | A1 | 5/2012 | Kim et al. |
| 2013/0124137 | A1 | 5/2013 | Kim et al. |

OTHER PUBLICATIONS

Relevant portions of the '315 Patent Application File History (U.S. Appl. No. 11/158,176).

Relevant portions of the '379 Patent Application File History (U.S. Appl. No. 12/185,216).

Relevant portions of the '181 Patent Application File History (U.S. Appl. No. 12/950,762).

Relevant portions of the '217 Patent Application File History (U.S. Appl. No. 13/358,804).

Ex Parte Reexamination Certificate for U.S. Pat. No. 8,352,217, Control No. 90/013,037, issued Aug. 22, 2014.

Ex Parte Reexamination Certificate for U.S. Pat. No. 8,108,181, Control No. 90/013,036, issued Oct. 31, 2014.

Ex Parte Reexamination Certificate for U.S. Pat. No. 7,840,379, Control No. 90/013,038, issued Nov. 14, 2014.

* cited by examiner

POWER CONTROL SYSTEM WITH PERFORMANCE MONITORING

CROSS-REFERENCE TO RELATED APPLICATIONS/INCORPORATION BY REFERENCE

This patent application is a continuation of U.S. patent application Ser. No. 13/735,004, filed on Jan. 6, 2013, now U.S. Pat. No. 8,639,473, which is a continuation of U.S. patent application Ser. No. 13/358,804, filed Jan. 26, 2012, now U.S. Pat. No. 8,352,217, which is a continuation of U.S. patent application Ser. No. 12/950,762, filed on Nov. 19, 2010, now U.S. Pat. No. 8,108,181, which is a continuation of U.S. patent application Ser. No. 12/185,216, filed on Aug. 4, 2008, now U.S. Pat. No. 7,840,379, which is a continuation of U.S. patent application Ser. No. 11/158,176, filed on Jun. 21, 2005, now U.S. Pat. No. 7,409,315, which claims the benefit of U.S. Provisional Application No. 60/583,913, filed on Jun. 28, 2004. This patent application is related to and claims priority from provisional patent application Ser. No. 60/583,913, filed Jun. 28, 2004 (mentioned above), and entitled "ON-BOARD PERFORMANCE MONITOR AND POWER CONTROL SYSTEM," the contents of which are hereby incorporated herein by reference in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND OF THE INVENTION

In electronic systems utilizing a power supply, a variety of integrated circuit chips, and variety of sub-circuits or modules within integrated circuit chips, the electronic systems may operate at various performance levels. Performance level may vary as a result of any of a variety of causes and conditions. For example and without limitation, power supply variation may affect performance level. Also for example, performance of a first component or subsystem may affect the performance of a second component or subsystem. Further for example, environmental conditions may affect performance level.

In various operational scenarios, desired performance level of a subsystem or component may vary. For example, in a first exemplary scenario, maximum performance level may be desired. In a second exemplary scenario, for example, a moderate performance level (e.g., at enhanced energy-efficiency) may be desired. In a third exemplary scenario, for example, a low performance level (e.g., in a power-save mode) may be desired.

In various operational scenarios, the performance level of a subsystem or component (including, for example, an integrated circuit) may not be as desired. For example, a system, subsystem or component may be operating at a relatively high performance level when a relatively low performance level is desired. Conversely for example, a system, subsystem or component may be operating at a relatively low performance level when a relatively high performance level is desired.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Various aspects of the present invention provide a system and method for controlling characteristics of supplied electrical power and/or performance based on monitored performance characteristics, substantially as shown in and/or described in connection with at least one of the figures, as set forth more completely in the claims. These and other advantages, aspects and novel features of the present invention, as well as details of illustrative aspects thereof, will be more fully understood from the following description and drawings.

DETAILED DESCRIPTION OF THE INVENTION

Figure 1:
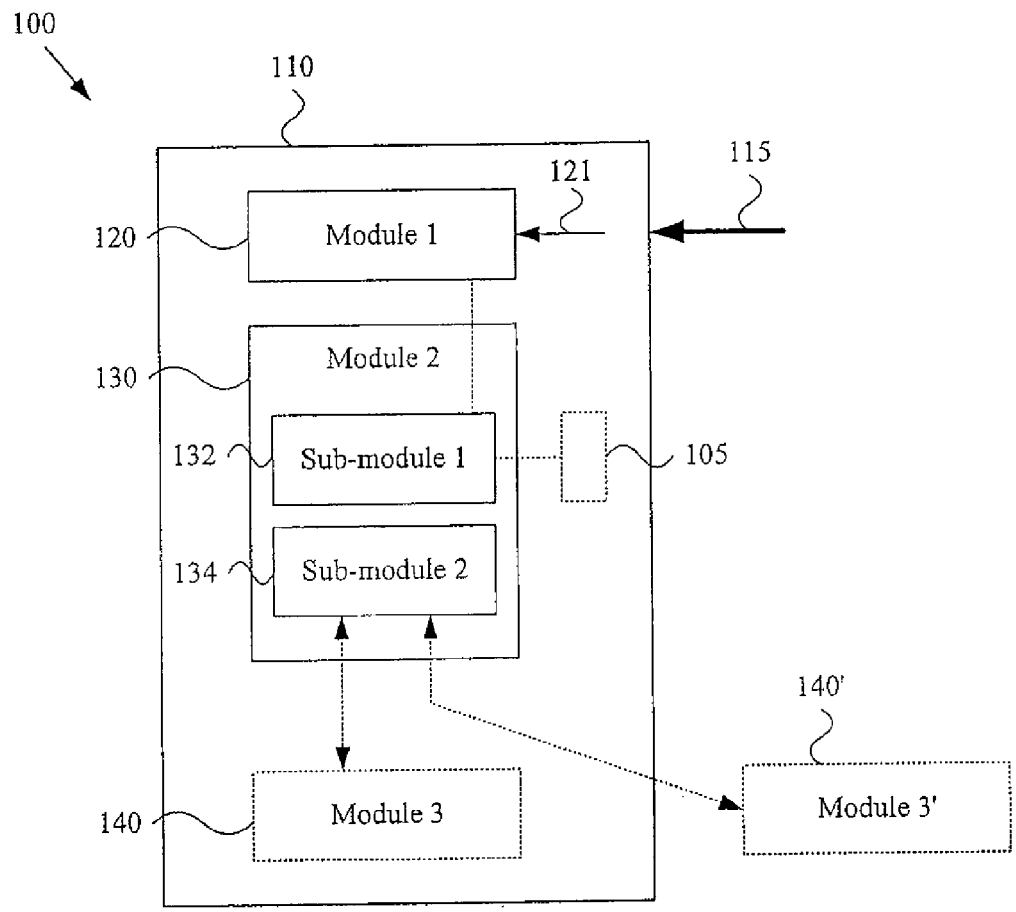
FIG. 1 shows a diagram of an exemplary performance control system, in accordance with various aspects of the present invention.

FIG. 1 shows a diagram of an exemplary performance control system 100, in accordance with various aspects of the present invention. The exemplary system 100 may comprise an integrated circuit 110 that receives electrical power 115. The integrated circuit 110 may comprise characteristics of any of a large variety of integrated circuits. For example and without limitation, the integrated circuit 110 may comprise a signal processing circuit, a microprocessor, an application-specific integrated circuit, a programmable logic array, a memory circuit, a multi-chip module, a microcontroller, etc. Accordingly, the scope of various aspects of the present invention should not be limited by characteristics of a particular integrated circuit type.

The following discussion will often utilize the term "module" or "circuit module" to describe a circuit or sub-circuit that performs a function. It must be recognized that a module may be implemented in hardware, software or a combination thereof. It must also be noted that various portions of modules may be shared. For example, a first module and a second module may share various hardware components and/or software routines. Accordingly, the scope of various aspects of the present invention should not be limited by particular module implementations or by arbitrary boundaries between modules.

The exemplary integrated circuit 110 may comprise a first circuit module 120 that receives electrical power 121 and utilizes the electrical power 121 to perform a function. The electrical power 121 may, for example, be identical to the electrical power 115 received by the integrated circuit 110 or may be different. For example, the electrical power 121 received by the first circuit module 120 may be related to (e.g., derived from) the electrical power 115 received by the integrated circuit 110 or may be independent. Accordingly, the scope of various aspects of the present invention should not be limited by characteristics of any particular relationship between electrical power received by the integrated circuit 110, the first circuit module 120, or any other module or component.

The first circuit module 120 may comprise characteristics of any of a large variety of circuit modules. For example and without limitation, the first circuit module 120 may comprise a signal processing module, a microprocessor module, an application-specific module, a programmable logic array module, a memory module, a plurality of coupled sub-modules, a microcontroller module, etc. Accordingly, the scope of various aspects of the present invention should not be limited by characteristics of a particular circuit module type.

The exemplary system 100 may comprise a second circuit module 130. The exemplary second circuit module 130 may comprise a first sub-module 132 and a second sub-module 134. The second circuit module 130 may, for example and without limitation, comprise a performance monitor module that monitors characteristics of module or integrated circuit performance and communicates information related to such monitoring activity.

The first sub-module 132 may, for example, monitor at least one performance characteristic of the integrated circuit 110. Also for example, the first sub-module 132 may monitor at least one performance characteristic of the first circuit module 120. Note that the first sub-module 132 may monitor at least one performance characteristic of the integrated circuit 110, the first circuit module 120 and/or other modules of the integrated circuit 110.

Monitored performance characteristics of the integrated circuit 110 or the first circuit module 120 may comprise any of a variety of circuit performance characteristics. For example and without limitation, such performance characteristics may comprise operational speed (e.g., processing speed, data throughput rate, delay time, response time, communication rate, etc.). Also for example, such performance characteristics may comprise operating temperature. Further for example, such performance characteristics may comprise a measurement of energy consumption or efficiency. Still further for example, such performance characteristics may comprise error rate or noise level. In general, the performance characteristics may comprise any of a variety of circuit performance characteristics. Accordingly, the scope of various aspects of the present invention should not be limited by any particular circuit performance characteristics.

It should be noted that the first sub-module 132 may monitor one or more performance characteristics for a plurality of functional aspects of at least one of the integrated circuit 110 and the first circuit module 120. For example, the first circuit module 120 may perform a plurality of discrete functions, performance characteristic(s) of which the first sub-module 132 may monitor. Accordingly, the scope of various aspects of the present invention should not be limited by a particular number of monitored performance characteristics or number of associated functional aspects.

Note that the first sub-module 132 may utilize any of a large variety of known or yet to be developed devices or mechanisms (e.g., performance sensors, detectors, hardware, software, etc.) to monitor performance characteristics. For example and without limitation, the first sub-module 132 may utilize a performance sensor or other circuitry incorporated in the first circuit module 120 or elsewhere in the integrated circuit 110 (e.g., as indicated by item 105) to monitor the performance of the first circuit module 120 or integrated circuit 110. Also for example, the first sub-module 132 may communicate performance data with the first circuit module 120 (e.g., over a communication link, as exemplified by link 107) or portion of the integrated circuit 110 and process such performance data to ascertain one or more particular performance characteristics for the first circuit module 120 or the integrated circuit 110. Accordingly, the scope of various aspects of the present invention should not be limited by characteristics of particular devices or mechanisms for monitoring various performance characteristics.

The exemplary system 100 illustrates the first sub-module 132 monitoring at least one performance characteristic of the integrated circuit 110 and/or the first circuit module 120. The first sub-module 132 may also, for example, monitor at least one performance characteristic of other circuit modules of the integrated circuit 110 that, for illustrative clarity, were not included in the FIG. 1 illustration. Accordingly, the scope of various aspects of the present invention should not be limited by a particular number of circuit modules for which performance characteristics may be monitored by the first sub-module 132.

The second circuit module 130 of the exemplary integrated circuit 110 may comprise a second sub-module 134, communicatively coupled to the first sub-module 132, that communicates with a third circuit module 140, 140' regarding the at least one performance characteristic monitored by the first sub-module 132. As illustrated in FIG. 1, the third circuit module 140, 140' may be a third circuit module 140 internal to the integrated circuit 110 or may be a third circuit module 140' external to the integrated circuit 110. The following discussion may refer to either the internal third circuit module 140 or the external third circuit module 140'. Such exemplary references are by no means to be construed as limiting various aspects of the third circuit module 140, 140' to an internal or external location relative to the integrated circuit 110. Accordingly, the scope of various aspects of the present invention should not be limited by a particular location of the third circuit module 140, 140'.

The second sub-module 134 may communicate information with the third circuit module 140, 140'. Such information may, for example, comprise information of the at least one monitored performance characteristic. In an exemplary scenario where the first sub-module 132 monitors a performance characteristic of the first circuit module 120 related to operational speed, the second sub-module 134 may communicate information regarding the monitored operational speed with the third circuit module 140, 140'. For example, such information may comprise information (relative or absolute) describing the monitored operational speed. Such information may, for example, comprise relatively low-resolution information (e.g., a one-bit threshold comparison indication) or relatively high-resolution information (e.g., operational speed per nanosecond resolution). Such information may, for example, comprise information represented in an analog or digital signal.

Also for example, the second sub-module 134 may communicate information with the third circuit module 140, 140' that comprises performance adjustment information. Such performance adjustment information may, for example, comprise a request for performance adjustment or a command for performance adjustment. Such performance adjustment information may comprise a request or command to adjust performance by a relative amount or by an absolute amount. In an exemplary scenario where the first sub-module 132 monitors an energy-efficiency characteristic, the second sub-module 134 may communicate information to the third circuit module 140, 140' indicating that the energy-efficiency level should be increased. In another exemplary scenario where the first sub-module 132 monitors operating temperature, the second sub-module 134 may communicate information to the third circuit module 140, 140' indicating that the operating temperature may be increased (or alternatively, that the operating temperature should be reduced).

The complexity of the second sub-module 134 may vary substantially. For example, in a first exemplary scenario, the second sub-module 134 may comprise a plurality of signal processing sub-circuits, each of which performs a signal processing or communicating activity (e.g., A/D conversion, data manipulation, data packaging, one or two-way data communication, etc.). In a second exemplary scenario, the second sub-module 134 may comprise a mere conduit (e.g., a wire or optical path) for information obtained by the first sub-module 132. Accordingly, the scope of various aspects of the present invention should not be limited by characteristics of particular degrees of module complexity.

As mentioned previously, the first sub-module 132 may monitor a plurality of performance characteristics for a plurality of functional aspects of a plurality of circuit modules. Accordingly, the second sub-module 134 may communicate information with the third circuit module 140, 140' regarding any, some or all of such monitored performance characteristics.

In general, the second sub-module 134 may communicate with the third circuit module 140, 140' regarding the at least one performance characteristic monitored by the first sub-module 132. Accordingly, the scope of various aspects of the present invention should not be limited by characteristics of a particular monitored performance characteristic or a particular type of information that may be communicated regarding a monitored performance characteristic.

The third circuit module 140 may, for example and without limitation, comprise a power controller module. For example, the third circuit module 140 may process information received from the second sub-module 134 to determine power control information utilized to control power supply circuitry. The third circuit module 140 may process the received information to determine power control information in any of a variety of manners.

For example and without limitation, the third circuit module 140 may compare performance information to performance goal information. The third circuit module 140 may, for example, determine whether the first circuit module 120 or integrated circuit 110 is achieving performance goals. Such performance goals may, for example and without limitation, comprise goals related to processing speed, response time, operating temperature, energy consumption, energy-efficiency, error rate, data throughput, etc.

The third circuit module 140 may determine whether a performance adjustment is desired. The third circuit module 140 may also, for example, determine how much of a performance adjustment is desired. Such determination(s) may, for example, comprise balancing various performance goals, which may be complementary or adversely related. The third circuit module 140 may then, for example, correlate performance or a performance change to various power supply characteristic(s). The third circuit module 140 may, for example, determine power control request or command signals to communicate with other circuitry, where the request or command signals are designed to provide for control over one or more power supply characteristics.

In an exemplary scenario, the third circuit module 140 may process information of monitored performance characteristics from the second sub-module 134 and determine that, while data processing speed is substantially exceeding the minimum data processing speed goal, energy consumption is in excess of the maximum energy consumption goal. The third circuit module 140 may then, for example, determine that a 2% decrease in power supply voltage level will decrease the energy consumption below the maximum energy consumption goal, while still providing for data processing speed at or above the minimum data processing speed goal.

In another exemplary scenario, the third circuit module 140 may process information of monitored performance characteristics from the second sub-module 134 and determine that, while the communication error rate is substantially below the maximum error rate goal, the operating temperature is above the maximum temperature goal. The third circuit module 140 may then, for example, determine that a 1.5% reduction in power supply voltage level will decrease operating temperature below the maximum temperature goal, while still meeting the error rate goal.

In a further exemplary scenario, the third circuit module 140 may process information of monitored performance characteristics from the second sub-module 134 and determine that energy-efficiency goals are comfortably being met, while data throughput rate goals are not being met due to power supply voltage instability. The third circuit module 140 may then, for example, determine that a 20% increase in power supply switching rate may reduce voltage variability below an acceptable maximum level, while still meeting energy-efficiency goals.

As mentioned previously, the third circuit module 140 (140') may be internal or external to the integrated circuit 110. In an exemplary scenario where the third circuit module 140 is internal to the integrated circuit 110, the third circuit module 140 may receive information regarding the at least one monitored performance characteristic from the second sub-module 134 and process such information to determine a power adjustment request (or command). The third circuit module 140 may then communicate the determined power adjustment request to power supply circuitry to request that the power supply circuitry modify various aspects of supplied electrical power.

In another exemplary scenario where the third circuit module 140' is external to the integrated circuit 110, the third circuit module 140' may receive information regarding the at least one monitored performance characteristic from the integrated circuit 110 (e.g., originating at the second sub-module 134) and process such information to determine a power adjustment command (or request). The third circuit module 140' may then communicate the determined power adjustment command to power supply circuitry to cause the power supply circuitry to modify various aspects of supplied electrical power.

In a further exemplary scenario where the third circuit module 140' is external to the integrated circuit 110 and internal to a power supply integrated circuit, the third circuit module 140' of the power supply integrated circuit may receive information regarding the at least one monitored performance characteristic from the integrated circuit 110 (e.g., originating at the second sub-module 134) and process such information to determine a power adjustment signal. The third circuit module 140' of the exemplary power supply integrated circuit may then utilize the power adjustment signal to cause the power supply integrated circuit to modify various aspects of electrical power output from the power supply integrated circuit.

In general, the third circuit module 140, 140' may be internal to the integrated circuit 110, external to the integrated circuit 110, an independent integrated circuit, part of a power supply integrated circuit, etc. Accordingly, the scope of various aspects of the present invention should not be limited by characteristics of a particular module location or integration.

As mentioned previously, the third circuit module 140 may receive information of one or more monitored performance characteristics for a plurality of modules and/or integrated circuits. In processing the received information to determine power supply control information, the third circuit module 140 may process the received information in any of a large variety of ways.

For example and without limitation, the third circuit module 140 may arbitrate between various modules and/or integrated circuits. Such arbitration may, for example, comprise considering respective performance goals or needs of the plurality of modules and/or integrated circuits. Such arbitration may, for example, comprise considering respective priorities of the plurality of modules and/or integrated circuits. For example, such arbitration may comprise determining power control information in accordance with the performance goals or needs of the highest priority module. Also for example, such arbitration may comprise determining power control information based on a priority-based or need-based weighted average. In general, such arbitration may comprise arbitrating between performance needs of various modules and/or integrated circuits. Accordingly, the scope of various aspects of the present invention should not be limited by characteristics of a particular arbitration scheme.

The third circuit module 140 may communicate power control information to power supply circuitry that provides electrical power to the integrated circuit 110, first circuit module 120, or other circuit module or integrated circuit. Such power control information may, for example, comprise controlling signals that directly control operation of the power supply circuitry. Such power control information may, for example, comprise a power supply request or command, which may be interpreted and processed by power supply circuitry that receives such a request or command. Such power control information may, for example, comprise any of a variety of information related to monitored performance of the integrated circuit 110, first circuit module 120, other circuit module(s), other integrated circuit(s), etc. Accordingly, the scope of various aspects of the present invention should not be limited by characteristics of particular power control information or by a particular destination for such power control information.

The exemplary system 100 illustrated in FIG. 1 and discussed previously is merely exemplary and was presented to illustrate a non-limiting portion of various aspects of the present invention. Accordingly, the scope of various aspects of the present invention should by no means be limited by characteristics of the exemplary system 100.

Figure 2:
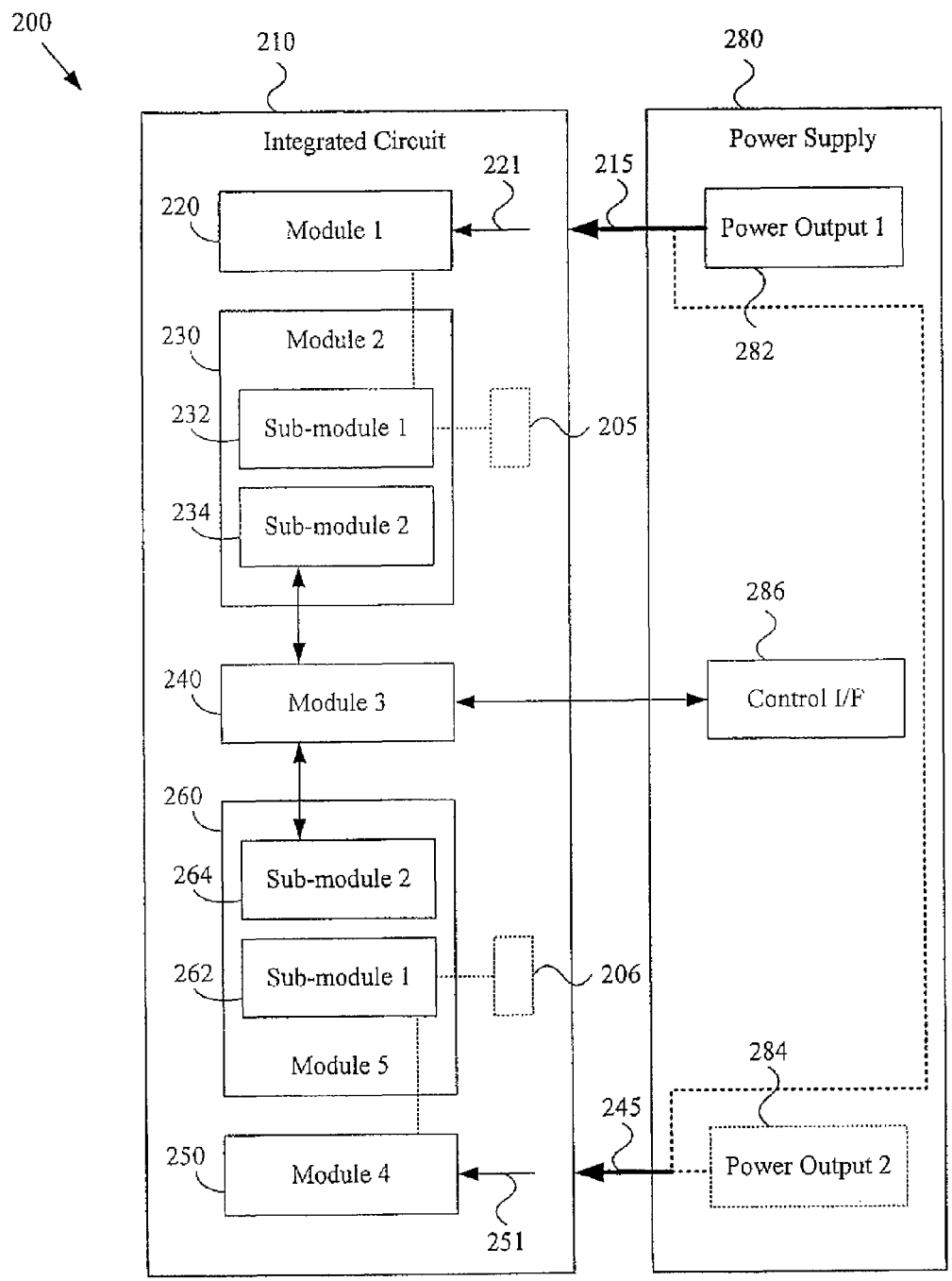
FIG. 2 shows a diagram of an exemplary power control system, in accordance with various aspects of the present invention.

FIG. 2 shows a diagram of an exemplary power control system 200, in accordance with various aspects of the present invention. The exemplary system 200 may, for example and without limitation, share various characteristics with the exemplary system 100 illustrated in FIG. 1 and discussed previously.

The exemplary system 200 may comprise an integrated circuit 210 that receives electrical power 215, 245. Portions of the exemplary integrated circuit 210 may, for example, share various characteristics with the exemplary integrated circuit 110 of the system 100 illustrated in FIG. 1 and discussed previously.

The exemplary system 200 may comprise a power supply circuit 280 that provides electrical power 215, 245 to the integrated circuit 210. The exemplary power supply circuit 280 may comprise a first power output module 282 that outputs electrical power 215 to the integrated circuit 210 and/or one or more modules thereof. The exemplary power supply circuit 280 may also, for example, comprise a second power output module 284 that outputs electrical power 245 to the integrated circuit 210 and/or one or more modules thereof. Note that the second power output 245 from the power supply circuit 280 may, for example, be output from the second power output module 284 or may (as indicated by the dashed line) be output from the first power output module 282. Accordingly, the second power output 245 from the power supply circuit 280 may be related to the first power output 215 or may be independent.

The exemplary power supply circuit 280 may, for example, comprise a control interface module 286 through which electrical devices external to the power supply circuit 280 may communicate with the power supply circuit 280. For example and without limitation, electrical devices external to the power supply circuit 280 may utilize the control interface module 286 to communicate power control information with the power supply circuit 280.

The power supply circuit 280 may comprise any of a large variety of power supply circuit characteristics. For example and without limitation, the power supply circuit 280 may be an independent power supply integrated circuit. The power supply circuit 280 may, for example, comprise discrete active and passive electrical components. The power supply circuit 280 may, for example, comprise one or more linear or non-linear regulators. Also for example, the power supply circuit 280 may comprise switching power supply circuitry (e.g., in a buck, boost, buck-boost or charge pump configuration). The power supply circuit 280 may, for example, comprise analog, digital or hybrid circuitry. The power supply circuit 280 may, for example, comprise one or more independently controllable outputs. Accordingly, the scope of various aspects of the present invention should not be limited by characteristics of a particular type of power supply circuit.

The exemplary integrated circuit 210 may comprise a first circuit module 220 that receives electrical power 221. The first circuit module 220 may, for example and without limitation, share various characteristics with the first circuit module 120 of the exemplary system 100 illustrated in FIG. 1 and discussed previously.

Similarly, the exemplary integrated circuit 210 may comprise a second circuit module 230. The second circuit module 230 may, for example and without limitation, share various characteristics with the second circuit module 130 of the exemplary system 100 illustrated in FIG. 1 and discussed previously.

Further, the exemplary integrated circuit 210 may comprise a third circuit module 240. The third circuit module 240 may, for example and without limitation, share various characteristics with the third circuit module 140 of the exemplary system 100 illustrated in FIG. 1 and discussed previously.

The exemplary integrated circuit 210 may comprise a fourth circuit module 250 that receives electrical power 251. The fourth circuit module 250 may, for example and without limitation, share various characteristics with the first circuit module 220.

The electrical power 251 received by the fourth circuit module 250 may, for example, be identical to the electrical power 245 received by the integrated circuit 210 or may be different. For example, the electrical power 251 received by the fourth circuit module 250 may be related to (e.g., derived from) the electrical power 245 received by the integrated circuit 210 or may be independent. Also for example, the electrical power 251 received by the fourth circuit module 250 may be related to the electrical power 215 received by the integrated circuit 210 or the electrical power 221 received by the first circuit module 220 or may be independent. Accordingly, the scope of various aspects of the present invention should not be limited by characteristics of any relationship between electrical power 215, 245 received by the integrated circuit 210, electrical power 221, 251 received by the first circuit module 221 and fourth circuit module 250, or electrical power received by any other module or component.

The fourth circuit module 250 may, for example, comprise characteristics of any of a large variety of circuit modules. For example and without limitation, the fourth circuit module 250 may comprise a signal processing module, a microprocessor module, an application-specific module, a programmable logic array module, a memory module, a plurality of coupled sub-modules, a microcontroller module, etc. Accordingly, the scope of various aspects of the present invention should not be limited by characteristics of a particular circuit module type.

The exemplary system 200 may comprise a fifth circuit module 260. The fifth circuit module 260 may, for example and without limitation, share various characteristics with the second circuit module 230.

For example, the exemplary fifth circuit module 260 may comprise a first sub-module 262 and a second sub-module 264. The fifth circuit module 260 may, for example and without limitation, comprise a performance monitor module that monitors performance characteristics of modules or integrated circuits and communicates information related to such monitoring activity.

The first sub-module 262 may, for example, monitor at least one performance characteristic of the integrated circuit 210. Also for example, the first sub-module 262 may monitor at least one performance characteristic of the fourth circuit module 250 and/or other modules of the integrated circuit 210. Note that the first sub-module 262 may monitor at least one performance characteristic of the integrated circuit 210 and/or the fourth circuit module 250.

It should be noted that the first sub-module 262 may monitor one or more performance characteristics for a plurality of functions performed by at least one of the integrated circuit 210 and the fourth circuit module 250. For example, the fourth circuit module 250 may perform a plurality of discrete functions, performance characteristics of which the first sub-module 262 may monitor. Accordingly, the scope of various aspects of the present invention should not be limited by a particular number of monitored performance characteristics or number of associated functional aspects.

Note that, as with the first sub-modules 232, 132 discussed previously, the first sub-module 262 may utilize any of a large variety of known or yet to be developed devices or mechanisms (e.g., performance sensors, detectors, hardware, software, etc.) to monitor performance characteristics. For example and without limitation, the first sub-module 262 may utilize a performance sensor or other circuitry incorporated in the fourth module 250 or elsewhere in the integrated circuit 110 (e.g., as indicated by item 206) to monitor the performance of the fourth sub-module 250 or integrated circuit 210. Also for example, the first sub-module 262 may communicate performance data with the fourth module 250 (e.g., over a communication link, as exemplified by link 208) or portion of the integrated circuit 210 and process such performance data to ascertain one or more particular performance characteristics for the fourth module 250 or the integrated circuit 210. Accordingly, the scope of various aspects of the present invention should not be limited by characteristics of particular devices or methods for monitoring various performance characteristics.

The exemplary system 200 illustrates the first sub-module 262 monitoring at least one performance characteristic of the integrated circuit 210 and/or the fourth circuit module 250. The first sub-module 262 may also, for example, monitor at least one performance characteristic of other circuit modules of the integrated circuit 210. Accordingly, the scope of various aspects of the present invention should not be limited by a particular number of circuit modules for which performance characteristics may be monitored by the first sub-module 262.

The fifth circuit module 260 of the exemplary system 100 may comprise a second sub-module 264, communicatively coupled to the first sub-module 262, that communicates with the third circuit module 240 regarding the at least one performance characteristic monitored by the first sub-module 262. As illustrated in FIG. 2, the third circuit module 240 may be internal to the integrated circuit 210. However, the third circuit module 240 need not be internal to the integrated circuit 210. The scope of various aspects of the present invention should not be limited by a particular location of the third circuit module 240.

The second sub-module 264 may communicate information with the third circuit module 240. Such information may, for example, comprise information of the at least one monitored performance characteristic. In an exemplary scenario where the first sub-module 262 monitors a performance characteristic of the fourth circuit module 250 related to operational speed, the second sub-module 264 may communicate information regarding the monitored operational speed with the third circuit module 240. For example, such information may comprise information (relative or absolute) describing the monitored operational speed. Such information may, for example, comprise relatively low-resolution information (e.g., a one-bit threshold comparison indication) or relatively high-resolution information (e.g., operational speed per nanosecond resolution).

Also for example, the second sub-module 264 may communicate information with the third circuit module 240 that comprises performance adjustment information. Such performance adjustment information may, for example, comprise a request for performance adjustment or a command for performance adjustment. Such performance adjustment information may comprise a request or command to adjust performance by a relative amount or by an absolute amount. In an exemplary scenario where the first sub-module 262 monitors an energy-efficiency characteristic, the second sub-module 264 may communicate information to the third circuit module 240 indicating that the energy-efficiency level should be increased. In another exemplary scenario where the first sub-module 262 monitors operating temperature, the second sub-module 264 may communicate information to the third circuit module 240 indicating that the operating temperature may be increased (or alternatively, that the operating temperature should be reduced).

As mentioned previously, the first sub-module 262 may monitor a plurality of performance characteristics for a plurality of functions for a plurality of circuit modules. Accordingly, the second sub-module 264 may communicate information with the third circuit module 240 regarding any, some or all of such monitored characteristics.

In general, the second sub-module 264 may communicate with the third circuit module 240 regarding the at least one performance characteristic monitored by the first sub-module 262. Accordingly, the scope of various aspects of the present invention should not be limited by characteristics of a particular monitored performance characteristic or particular type of information that may be communicated regarding a monitored performance characteristic.

As mentioned previously, the exemplary system 200 may comprise a third circuit module 240 with which the second sub-module 264 may communicate information regarding the at least one monitored performance characteristic. Also as previously discussed, the third circuit module 240 may be internal to the integrated circuit 210, or the third circuit module 240 may be external to the integrated circuit 210. The following discussion may generally refer to the third circuit module 240 as being internal to the integrated circuit 210. Such exemplary discussion is by no means to be construed as limiting various aspects of the third circuit module 240 to an internal location relative to the integrated circuit 210.

For example and without limitation, the third circuit module 240 may comprise a power controller module. For example, the third circuit module 240 may process information received from the second sub-module 264 to determine power control information utilized to control power supply circuitry. As mentioned in the previous discussion of the exemplary third circuit module 140 of FIG. 1, the third circuit module 240 may process the received information to determine power control information in any of a variety of manners.

In an exemplary scenario, the third circuit module 240 may receive information regarding the at least one monitored performance characteristic from the second sub-module 264 and process such information to determine a power adjustment request (or command). The third circuit module 240 may then communicate the determined power adjustment request to power supply circuitry to request that the power supply circuitry modify various aspects of supplied electrical power. For example, the third circuit module 240 may communicate a power adjustment request through the control interface module 286 to at least one of the first power output module 282 and the second power output module 284 of the power supply circuit 280. The power supply circuit 280 may then, for example, respond to the communicated power adjustment request (or command) by adjusting one or more characteristics of electrical power output from the power supply circuit 280.

As mentioned previously, the third circuit module 240 may receive information regarding one or more monitored performance characteristics for a plurality of modules and/or integrated circuits. In processing the received information to determine power supply control information, the third circuit module 240 may process the received information in any of a large variety of ways.

For example and without limitation, the third circuit module 240 may arbitrate between various modules and/or integrated circuits. Such arbitration may, for example, comprise considering respective performance goals or needs of the plurality of modules and/or integrated circuits. Such arbitration may, for example, comprise considering respective priorities of the plurality of modules and/or integrated circuits. For example, such arbitration may comprise determining power control information in accordance with the performance goals or needs of the highest priority module. Also for example, such arbitration may comprise determining power control information based on a priority-based or need-based weighted average.

In an exemplary scenario, the third circuit module 240 may receive information regarding monitored performance characteristics from the second sub-module 234 of the second circuit module 230 and from the second sub-module 264 of the fifth circuit module 260. The third circuit module 240 may, in the exemplary scenario, determine that the performance goals or needs of the first circuit module 220 outweigh the performance goals or needs of the fourth circuit module 250, and determine power supply control information based on the performance goals or needs of the first circuit module 220 and the information regarding the monitored performance characteristics received from the second circuit module 230.

Alternatively, for example, the third circuit module 240 may, in an exemplary scenario, determine that the performance goals or needs of the first circuit module 220 and the fourth circuit module 250 are equal, and determine power supply control information based equally on the performance goals or needs of the first circuit module 220 and monitored performance characteristics received from the second circuit module 230, and on the performance goals or needs of the fourth circuit module 250 and monitored performance characteristics received from the fifth circuit module 260.

In general, such arbitration may comprise arbitrating between performance goals or needs of various modules. Accordingly, the scope of various aspects of the present invention should not be limited by characteristics of a particular arbitration scheme.

The third circuit module 240 may communicate power control information to the power supply circuit 280 that provides electrical power to the integrated circuit 210, first circuit module 220, fourth circuit module 250 or other circuit module or integrated circuit. The third circuit module 240 may, for example, communicate power control information to the power supply circuit 280 through the control interface module 286.

Such power control information may, for example, comprise controlling signals that directly control operation of the power supply circuit 280 (e.g., the first power output module 282 and/or the second power output module 284). Such power control information may, for example, comprise a power supply request or command, which may be interpreted and processed by power supply circuit 280. In general, such power control information may, for example, comprise any of a variety of information related to monitored performance of the integrated circuit 210, first circuit module 220, fourth circuit module 250, other circuit module(s), other integrated circuit(s), etc. Accordingly, the scope of various aspects of the present invention should not be limited by characteristics of particular power control information or by a particular destination for such power control information.

The exemplary system 200 illustrated in FIG. 2 and discussed previously is merely exemplary, and was presented to illustrate a non-limiting portion of various aspects of the present invention. Accordingly, the scope of various aspects of the present invention should by no means be limited by characteristics of the exemplary system 200.

Figure 3:
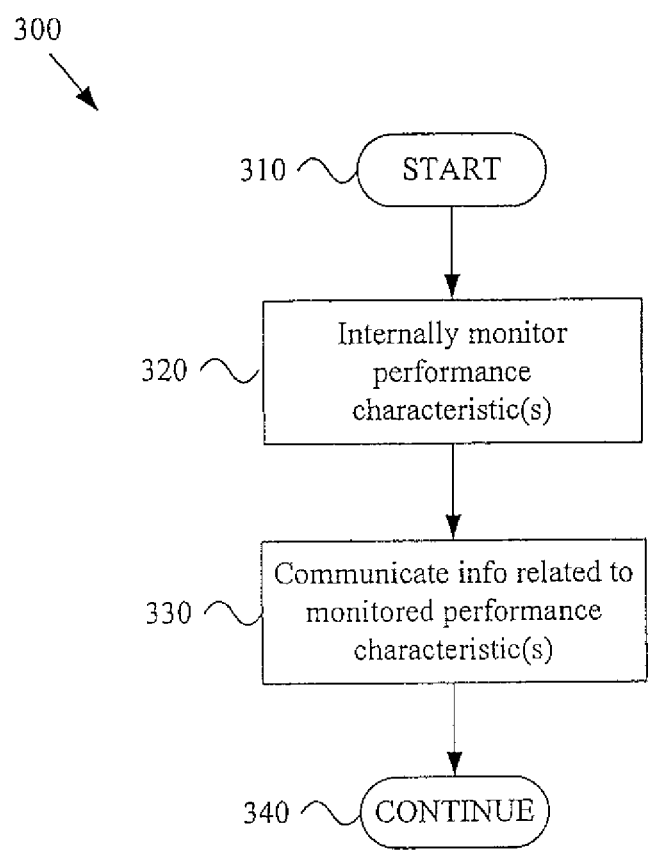
FIG. 3 illustrates an exemplary method for controlling performance, in accordance with various aspects of the present invention.

FIG. 3 illustrates an exemplary method 300 for controlling performance (e.g., in an integrated circuit), in accordance with various aspects of the present invention. The exemplary method 300 may, for example and without limitation, share various characteristics with functionality discussed previously with regard to the exemplary systems 100, 200 illustrated in FIGS. 1-2.

The exemplary method 300 may begin at step 310. The exemplary method 300 (and any method discussed herein) may begin in response to any of a large variety of causes and conditions. For example and without limitation, the method 300 may begin automatically when a system that is implementing the method 300 is powered up. Alternatively, for example, the method 300 may begin in response to an explicit command to begin (e.g., a command from another module in the system or from a user). Further for example, the method 300 may begin in response to a detected operating condition. Accordingly, the scope of various aspects of the present invention should not be limited by characteristics of any particular initiating events or conditions.

The exemplary method 300 may, at step 320, comprise monitoring at least one performance characteristic of at least one of the integrated circuit and a first circuit module of the integrated circuit. For example and without limitation, step 320 may share various characteristics with the functionality performed by the first sub-module 132 of the exemplary system 100 illustrated in FIG. 1 and discussed previously.

The integrated circuit and/or first circuit module may comprise any of a large variety of integrated circuit or module characteristics. For example and without limitation, the integrated circuit and/or module may comprise signal processing circuitry, microprocessor circuitry, application-specific integrated circuitry, programmable logic array circuitry, memory circuitry, multi-chip module circuitry, microcontroller circuitry, etc. Accordingly, the scope of various aspects of the present invention should not be limited by characteristics of a particular integrated circuit or module type.

As mentioned previously, monitored performance characteristics of the integrated circuit or the first module may comprise any of a variety of circuit performance characteristics. Accordingly, the scope of various aspects of the present invention should not be limited by any particular circuit performance characteristics.

It should be noted that exemplary step 320 may comprise monitoring one or more performance characteristics for one or more functional aspects of at least one of the integrated circuit and the first circuit module of the integrated circuit. For example, the first circuit module may perform a plurality of functions, performance characteristic(s) of which step 320 may comprise monitoring. Accordingly, the scope of various aspects of the present invention should not be limited by a particular number of monitored performance characteristics or number of functional aspects.

Also, step 320 may comprise monitoring at least one performance characteristic of other circuit modules of the integrated circuit. Accordingly, the scope of various aspects of the present invention should not be limited by a particular number of circuit modules for which step 320 comprises monitoring at least one performance characteristic.

The exemplary method 300 may, at step 330, comprise communicating information related to the monitored at least one performance characteristic with a third circuit module. Such a third circuit module may, for example, comprise circuitry internal or external to the integrated circuit. For example and without limitation, step 330 may share various characteristics with the functionality performed by the second sub-module 134 of the exemplary system 100 illustrated in FIG. 1 and discussed previously.

The third circuit module may comprise any of a large variety of electrical circuit characteristics. For example and without limitation, the third circuit module may comprise characteristics of the third circuit module 140' (or 140) of the exemplary system 100 illustrated in FIG. 1 and discussed previously. Also for example, the third circuit module may comprise characteristics of the third circuit module 240 and/or control interface module 286 of the exemplary system 200 illustrated in FIG. 2 and discussed previously.

For example, the third circuit module may comprise a power controller module. Such a power controller module may, for example, be an independent circuit module or an independent integrated circuit. Such a power controller module may, for example, be a component of a power supply circuit (e.g., a power supply integrated circuit). The third circuit module may, for example, comprise a power supply circuit that provides power to the integrated circuit and/or the first circuit module of the integrated circuit. Accordingly, the scope of various aspects of the present invention should not be limited by characteristics of a particular circuit module.

The information related to the monitored at least one performance characteristic may comprise any of a large number of information types. For example and without limitation, such information may comprise information of the at least one monitored characteristic. In an exemplary scenario where step 320 comprises monitoring an operational speed characteristic of the integrated circuit, step 330 may comprise communicating information regarding the monitored operational speed with the third circuit module. For example, such information may comprise information (relative or absolute) describing the monitored operational speed. Such information may, for example, comprise relatively low-resolution information (e.g., a one-bit threshold comparison indication) or relatively high-resolution information (e.g., operational speed per nanosecond resolution). Such information may, for example, comprise information represented in an analog or digital format.

Also for example, step 330 may comprise communicating information with the third circuit module that comprises performance adjustment information. Such performance adjustment information may, for example, comprise a request for performance adjustment or a command for performance adjustment. Such performance adjustment information may comprise a request or command to adjust performance by a relative amount or by an absolute amount. In an exemplary scenario where step 320 comprises monitoring an energy-efficiency characteristic, step 330 may comprise communicating information to the third circuit module indicating that the energy-efficiency level should be increased (e.g., by an increment or a particular amount). In another exemplary scenario where step 320 comprises monitoring an operating temperature characteristic, step 330 may comprise communicating information to the third circuit module indicating that the operating temperature may be increased (or alternatively, that the operating temperature should be reduced).

Step 330 may, for example, also comprise determining the information to communicate to the third circuit module. Such a determination may vary substantially in complexity. For example, in a first exemplary scenario, step 330 may comprise performing an array of signal processing and/or information communicating activities (e.g., A/D conversion, data manipulation, data packaging, one or two-way data communication, etc.). In a second exemplary scenario, step 330 may comprise merely forwarding the information obtained at step 320. Accordingly, the scope of various aspects of the present invention should not be limited by characteristics of particular degrees of information processing or communicating complexity. Additional exemplary aspects of determining the information to communicate to the third circuit module will be discussed regarding the exemplary method 400 illustrated in FIG. 4.

As mentioned previously, step 320 may comprise monitoring a plurality of performance characteristics for a plurality of functional aspects of a plurality of circuit modules and/or the integrated circuit. Accordingly, step 330 may comprise communicating information with the third circuit module regarding any, some or all of such monitored characteristics.

In general, exemplary step 330 may comprise communicating with a third circuit module, which may be internal or external to the integrated circuit, regarding the at least one performance characteristic monitored at step 320. Accordingly, the scope of various aspects of the present invention should not be limited by aspects of a particular monitored performance characteristic or particular type of information that may be communicated regarding a monitored performance characteristic.

The exemplary method 300 may, at step 350, comprise performing continued processing. Such continued processing 350 may, in the exemplary method 300 and all methods discussed herein, comprise characteristics for any of a large variety of continued processing. Such continued processing 350 may, for example, comprise looping back to repeat previous steps of the method 300. Such continued processing 350 may, for example, comprise entering a wait state before repeating previous steps. Also for example, such continued processing 350 may comprise performing additional power control processing. Accordingly, the scope of various aspects of the present invention should not be limited by characteristics of any particular type of continued processing.

Figure 4:
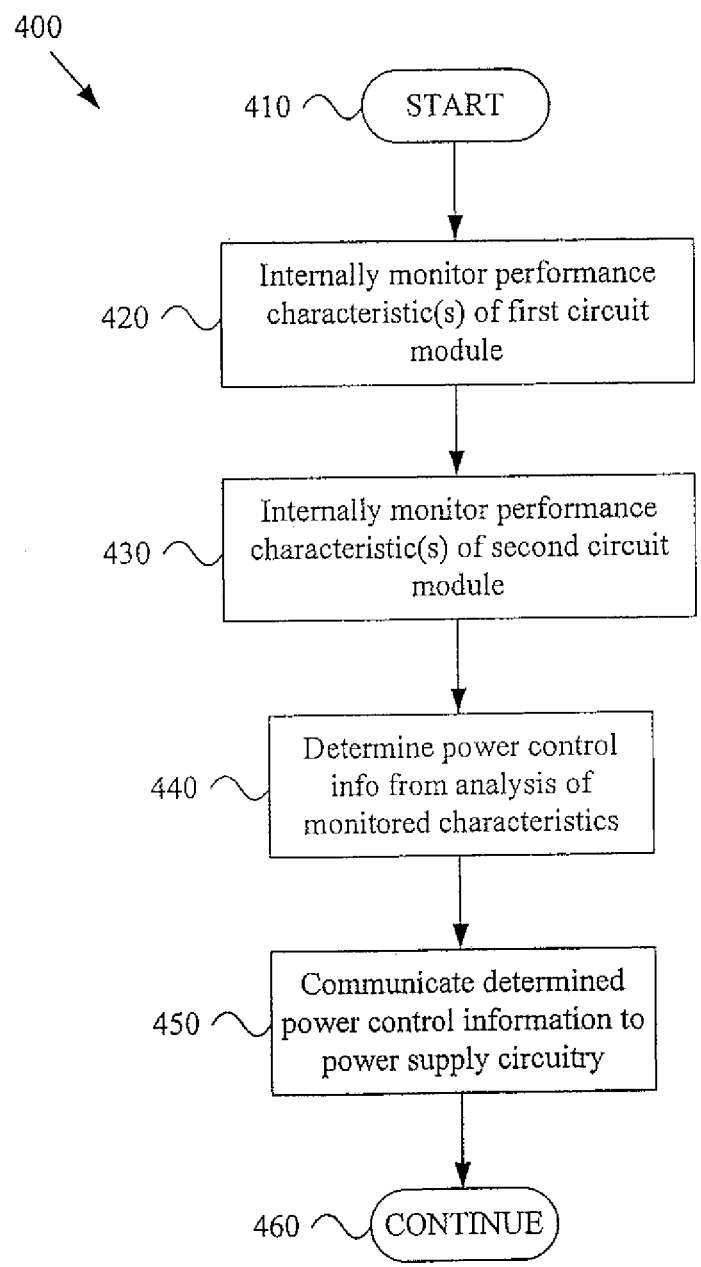
FIG. 4 illustrates an exemplary method for controlling power, in accordance with various aspects of the present invention.

FIG. 4 illustrates an exemplary method 400 for controlling power, in accordance with various aspects of the present invention. The exemplary method 400 may, for example and without limitation, share various characteristics with the exemplary method 300 illustrated in FIG. 3 and discussed previously. Further for example, the exemplary method 400 may share various characteristics with functionality discussed previously with regard to the exemplary systems 100, 200 illustrated in FIGS. 1-2 and discussed previously.

The exemplary method 400 may, at step 420, comprise monitoring (e.g., internal to an integrated circuit) at least one performance characteristic of at least one of the integrated circuit and a first circuit module of the integrated circuit. For example and without limitation, step 420 may share various characteristics with step 320 of the exemplary method 300 illustrated in FIG. 3 and discussed previously. Also for example, step 420 may share various characteristics with the functionality performed by the first sub-module. 132 of the exemplary system 100 illustrated in FIG. 1 and discussed previously and functionality performed by the first sub-module 232 of the second circuit module 230 of the exemplary system 200 illustrated in FIG. 2 and discussed previously.

The exemplary method 400 may, at step 430, comprise monitoring (e.g., internal to the integrated circuit) at least one performance characteristic of a second circuit module of the integrated circuit. For example, step 430 may share various characteristics with step 420, albeit with regard to a second circuit module rather than the first circuit module.

The exemplary method 400 may, at step 440, comprise determining power control information from an analysis of at least a portion of performance characteristics monitored at steps 420 and 430. For example and without limitation, step 440 may share various characteristics with the functionality discussed previously with regard to the second sub-module 134 and third circuit module 140 of the exemplary system 100 illustrated in FIG. 1 and discussed previously, and with the third circuit module 240 of the exemplary system 200 illustrated in FIG. 2 and discussed previously.

Such power control information may, for example, comprise controlling signals that directly control operation of the power supply circuitry. Such power control information may, for example, comprise a power supply request or command, which may be interpreted and processed by power supply circuitry that receives such a request or command. Such power control information may, for example, comprise any of a variety of information related to monitored performance characteristics monitored at steps 420 and 430. Accordingly, the scope of various aspects of the present invention should not be limited by characteristics of particular power control information.

Step 440 may comprise determining power control information by analyzing the performance characteristics monitored at steps 420 and 430 in any of a variety of ways. For example and without limitation, step 440 may comprise arbitrating between various modules and/or integrated circuits. Such arbitration may, for example, comprise considering respective performance goals or needs of the plurality of modules and/or integrated circuits. Such arbitration may, for example, comprise considering respective priorities of the plurality of modules and/or integrated circuits. For example, such arbitration may comprise determining power control information in accordance with the performance goals or needs of the highest priority module. Also for example, such arbitration may comprise determining power control information based on a priority-based or need-based weighted average.

In an exemplary scenario, step 440 may comprise processing information regarding performance characteristics of a first circuit module (e.g., as monitored at step 420) and information regarding performance characteristics of a second circuit module (e.g., as monitored at step 430). Step 440 may, in the exemplary scenario, comprise determining that the performance goals or needs of the first circuit module outweigh the performance goals or needs of the second circuit module, and determining power supply control information based on the performance goals or needs of the first circuit module and the information regarding performance characteristics of the first circuit module.

In another exemplary scenario, step 440 may comprise processing information regarding performance characteristics of a first circuit module (e.g., as monitored at step 420) and information regarding performance characteristics of a second circuit module (e.g., as monitored at step 430). Step 440 may, in the exemplary scenario, comprise determining that the performance goals or needs of the first circuit module are equal to the performance goals or needs of the second circuit module, and determining power supply control information based equally on the performance goals or needs of the first circuit module and the information regarding performance characteristics of the first circuit module, and with the performance goals or needs of the second circuit module and the information regarding performance characteristics of the second circuit module.

In still another exemplary scenario, step 440 may comprise processing information regarding performance characteristics of a first circuit module (e.g., as monitored at step 420) and information regarding performance characteristics of a second circuit module (e.g., as monitored at step 430). Step 440 may, in the exemplary scenario, comprise determining that the performance goals or needs of the first circuit module are prioritized higher than the performance goals or needs of the second circuit module, and determining power supply control information based on a priority-based weighted average of the performance goals or needs of the first circuit module and the information regarding performance characteristics of the first circuit module, and the performance goals or needs of the second circuit module and the information regarding performance characteristics of the second circuit module.

In general, exemplary step 440 may comprise determining power control information from an analysis of performance characteristics monitored at steps 420 and 430. Accordingly, the scope of various aspects of the present invention should not be limited by characteristics of a particular analysis or determination of power control information.

The exemplary method 400 may, at step 450, comprise communicating the power control information (e.g., as determined at step 440) to power supply circuitry that provides electrical power to the first and second circuit modules. For example and without limitation, step 450 may share various characteristics with step 330 of the exemplary method 300 illustrated in FIG. 3 and discussed previously. Also for example, step 450 may share various characteristics with functionality performed by the second sub-module 134 and third circuit module 140 of the exemplary system 100 illustrated in FIG. 1 and discussed previously, and with the third circuit module 240 of the exemplary system 200 illustrated in FIG. 2 and discussed previously.

The exemplary method 400 discussed above presents an exemplary illustration comprising monitoring performance characteristics of first and second circuit modules (or the integrated circuit) and determining power control information based, at least in part, on such monitored performance characteristics. It should be noted that various aspects of the exemplary illustration are readily extensible to systems comprising any number of circuit modules. Accordingly, the scope of various aspects of the present invention should not be limited to a particular number of circuit modules for which performance characteristics may be monitored and utilized to determine power control information.

Figure 5:
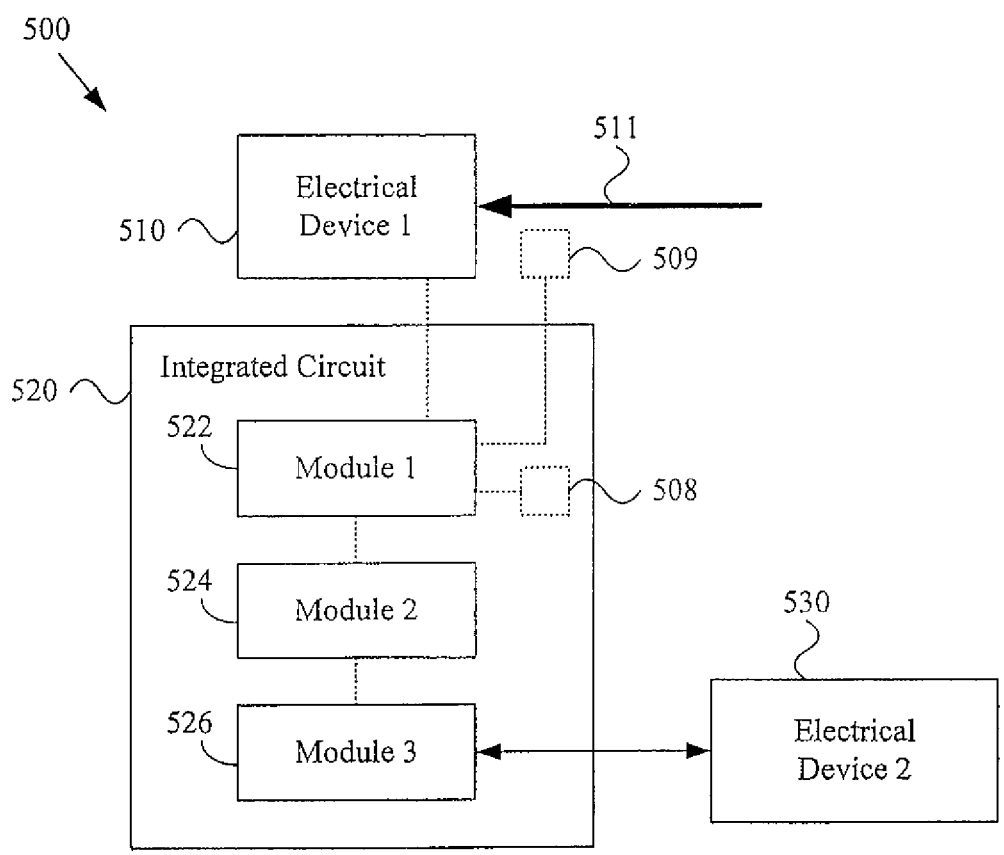
FIG. 5 shows a diagram of an exemplary performance control system, in accordance with various aspects of the present invention.

FIG. 5 shows a diagram of an exemplary performance control system 500, in accordance with various aspects of the present invention. For example and without limitation, the exemplary system 500 may share various characteristics with the exemplary systems 100, 200 illustrated in FIGS. 1-2 and discussed previously.

The exemplary system 500 may comprise a first electrical device 510 that receives electrical power 511. The first electrical device 510 may comprise characteristics of any of a large variety of electrical devices. For example and without limitation, the first electrical device 510 may comprise a signal processing circuit, a microprocessor, an application-specific integrated circuit, a programmable logic array, a memory circuit, a multi-chip module, a microcontroller, various combinations of active and/or passive components, etc. Accordingly, the scope of various aspects of the present invention should not be limited by characteristics of a particular electrical device type.

The exemplary system 500 may comprise an integrated circuit 520. The electrical device 510 may, for example, be external to the integrated circuit 520. The integrated circuit 520 may, in turn, comprise a first module 522, a second module 524 and a third module 526. The first module 522 may be communicatively coupled to the second module 524, which may in turn, be communicatively coupled to the third module 526.

For example and without limitation, the first module 522 may share various characteristics with the first sub-modules 132, 232, 262 of the exemplary systems 100, 200 illustrated in FIGS. 1-2 and discussed previously.

The exemplary first module 522 may, for example, comprise a performance monitor module that monitors performance characteristics and communicates information related to such monitoring activity. The first module 522 may, for example, monitor at least one performance characteristic of the first electrical device 510.

As discussed previously, monitored performance characteristics may comprise any of a variety of circuit performance characteristics. Accordingly, the scope of various aspects of the present invention should not be limited by any particular circuit performance characteristics.

It should be noted that the first module 522 may monitor one or more performance characteristics for the first electrical device 510. Accordingly, the scope of various aspects of the present invention should not be limited by a particular number of performance characteristics that may be monitored.

Note that the first module 522 may utilize any of a large variety of known or yet to be developed devices or mechanisms (e.g., performance sensors, detectors, hardware, software, etc.) to monitor performance characteristics. For example and without limitation, the first module 522 may utilize a performance sensor or other circuitry incorporated in the first electrical device 510, incorporated in the integrated circuit 520 (e.g., as indicated by item 508) or elsewhere in the system 500 (e.g., as indicated by item 509). Also for example, the first module 522 may communicate performance data with the first electrical device 510 and process such performance data to ascertain one or more particular performance characteristics for the first electrical device 510. Accordingly, the scope of various aspects of the present invention should not be limited by characteristics of particular devices or methods for monitoring various electrical power characteristics.

The exemplary system 500 illustrates the first module 522 monitoring at least one performance characteristic of the first electrical device 510. The first module 522 may also, for example, monitor at least one performance characteristic of other electrical devices. Accordingly, the scope of various aspects of the present invention should not be limited by a particular number of devices for which performance characteristics may be monitored by the first module 522.

The exemplary integrated circuit 520 may comprise a second module 524 with which the first module 522 may communicate information regarding the at least one monitored performance characteristic. For example and without limitation, the second module 524 may comprise a power controller module. For example, the second module 524 may process performance characteristic information received from the first module 522 to determine power control information, which may be utilized to control power supply circuitry. The second module 524 may process the received performance characteristic information to determine power control information in any of a variety of manners.

For example and without limitation, the second module 524 may compare information of monitored performance to performance goal information. The second module 524 may, for example, determine whether the first electrical device 510 (and/or other device) is achieving performance goals. Such performance goals may, for example and without limitation, comprise goals related to processing speed, response time, operating temperature, energy consumption, energy-efficiency, error rate, data throughput, etc.

The second module 524 may, for example, determine whether a performance adjustment is desired. The second module 524 may also, for example, determine how much of a performance adjustment is desired. Such determination(s) may, for example, comprise balancing various performance goals, which may be complementary or adversely related. The second module 524 may then, for example, correlate performance or a performance change to various power supply characteristic(s). The second module 524 may, for example, determine power control request or command signals to communicate with other circuitry, where the request or command signals are designed to provide for control over one or more power supply characteristics.

In an exemplary scenario, the second module 524 may process information of monitored performance characteristics from the first module 522 and determine that, while data processing speed is substantially exceeding the minimum data processing speed goal, energy consumption is in excess of the maximum energy consumption goal. The second module 524 may then, for example, determine that a 2% decrease in power supply voltage level will decrease the energy consumption below the maximum energy consumption goal, while still providing for data processing speed at or above the minimum data processing speed goal. The second module 524 may then, for example, determine power control information that, when processed by power supply circuitry, may cause such a 2% decrease in power supply voltage level.

In another exemplary scenario, the second module 524 may process information of monitored performance characteristics from the first module 522 and determine that, while the communication error rate is substantially below the maximum error rate goal, the operating temperature is above the maximum temperature goal. The second module 524 may then, for example, determine that a 1.5% reduction in power supply voltage level will decrease operating temperature below the maximum temperature goal, while still meeting the error rate goal. The second module 524 may then, for example, determine power control information that, when processed by power supply circuitry, may cause such a 1.5% reduction in power supply voltage level.

In a further exemplary scenario, the second module 524 may process information of monitored performance characteristics from the first module 522 and determine that energy-efficiency goals are comfortably being met, while data throughput rate goals are not being met due to power supply voltage instability. The second module 524 may then, for example, determine that a 20% increase in power supply switching rate may reduce voltage variation below an acceptable maximum level, while still meeting energy-efficiency goals. The second module 524 may then, for example, determine power control information that, when processed by power supply circuitry, may cause such a 20% increase in power supply switching rate.

As mentioned previously, the second module 524 may receive information of one or more monitored performance characteristics for a plurality of electrical devices (e.g., external to the integrated circuit 520). In processing the received information to determine power supply control information, the second module 524 may process the received information in any of a large variety of ways.

For example and without limitation, the second module 524 may arbitrate between various electrical devices. Such arbitration may, for example, comprise considering respective performance goals or needs of the plurality of electrical devices. Such arbitration may, for example, comprise considering respective priorities of the plurality of electrical devices. For example, such arbitration may comprise determining power control information in accordance with the performance goals or needs of the highest priority electrical device. Also for example, such arbitration may comprise determining power control information based on a priority-based or need-based weighted average. In general, such arbitration may comprise arbitrating between performance goals or needs of various electrical devices. Accordingly, the scope of various aspects of the present invention should not be limited by characteristics of a particular arbitration scheme.

The third module 526 may receive the power control information determined by the second module 524 and communicate the power control information to a second electrical device 530 (e.g., external to the integrated circuit 520). The third module 526 may, for example and without limitation, share various characteristics with the second sub-module 134 and third circuit module 140 of the exemplary system 100 and the second sub-modules 234, 264 and third circuit module 240 of the exemplary system 200, as illustrated in FIGS. 1-2 and discussed previously.

The second electrical device 530 may, for example and without limitation, comprise power managing and/or power supply circuitry. The second electrical device 530 may, for example, provide electrical power to the integrated circuit 520, first electrical device 510, or other electrical device(s). The second electrical device 530 may comprise any of a variety of circuitry, and accordingly, the scope of various aspects of the present invention should not be limited by characteristics of a particular type of electrical device.

The power control information may for example, comprise controlling signals that directly control operation of power supply circuitry. Such power control information may, for example, comprise a power supply request or command, which may be interpreted and processed by power supply circuitry that receives such a request or command. Such power control information may, for example, comprise any of a variety of information related to monitored performance of the first electrical device 510 or other electrical devices. Accordingly, the scope of various aspects of the present invention should not be limited by characteristics of particular power control information or by a particular destination for such power control information.

The complexity of the third module 526 may vary substantially, depending on the circuit and/or system architecture. For example, in a first exemplary scenario, the third module 526 may comprise a plurality of signal processing sub-circuits, each of which performs a signal processing or communicating activity (e.g., A/D conversion, data manipulation, data packaging, one or two-way data communication, etc.). In a second exemplary scenario, the third module 526 may comprise a mere conduit (e.g., a wire or optical path) for information determined by the second module 524. Accordingly, the scope of various aspects of the present invention should not be limited by characteristics of particular degrees of module complexity.

In general, the third module 526 may communicate with a second electrical device 530, external to the integrated circuit 520, regarding the power control information determined by the second module 540. Accordingly, the scope of various aspects of the present invention should not be limited by characteristics of a particular monitored performance characteristic or a particular type of information that may be communicated regarding a monitored performance characteristic.

The exemplary system 500 illustrated in FIG. 5 and discussed previously is merely exemplary and was presented to illustrate a non-limiting portion of various aspects of the present invention. Accordingly, the scope of various aspects of the present invention should by no means be limited by characteristics of the exemplary system 500.

Figure 6:
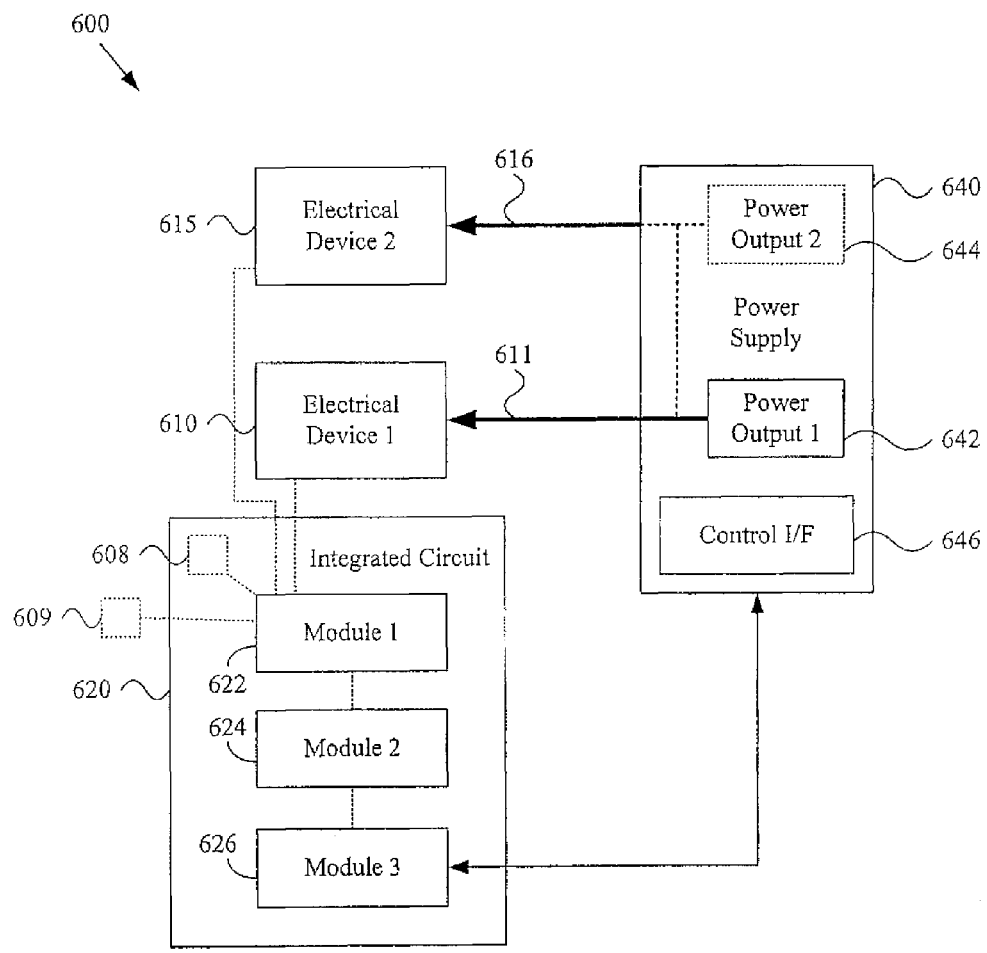
FIG. 6 shows a diagram of an exemplary power control system, in accordance with various aspects of the present invention.

FIG. 6 shows a diagram of an exemplary power control system 600, in accordance with various aspects of the present invention. The exemplary system 600 may, for example and without limitation, share various characteristics with the exemplary system 500 illustrated in FIG. 5 and discussed previously.

The exemplary system 600 may comprise a first electrical device 610 that receives electrical power 611. The exemplary system 600 may also comprise a second electrical device 615 that receives electrical power 616. Such received electrical power 611, 616 may, for example, comprise electrical power received at a single power input or a plurality of power inputs. For example and without limitation, received electrical power may comprise power received at a plurality of electrical voltage levels.

The first and second electrical devices 610, 615 may comprise characteristics of any of a large variety of electrical devices. For example and without limitation, the first and second electrical devices 610, 615 may comprise signal processing circuitry, microprocessor circuitry, application-specific integrated circuitry, programmable logic array circuitry, a memory circuit, a plurality of coupled sub-circuits, a microcontroller circuit, etc. Accordingly, the scope of various aspects of the present invention should not be limited by characteristics of a particular circuit type.

The exemplary system 600 may comprise a power supply circuit 640 that provides electrical power 611, 616 to the first and second electrical devices 610, 615. The exemplary power supply circuit 640 may comprise a first power output module 642 that outputs electrical power 611 to the first electrical device 610. The exemplary power supply circuit 640 may also, for example, comprise a second power output module 644 that outputs electrical power 616 to the second electrical device 615. Note that the second power output from the power supply circuit 640 may, for example, be output from the second power output module 644 or may (as indicated by the dashed line) be output from the first power output module 642. Accordingly, the second power output 616 from the power supply circuit 640 may be related to the first power output 611 or may be independent.

The exemplary power supply circuit 640 may, for example, comprise a control interface module 646 through which electrical devices external to the power supply circuit 640 may communicate with the power supply circuit 640. For example and without limitation, electrical devices external to the power supply circuit 640 may utilize the control interface module 646 to communicate power control information to the power supply circuit 640.

The power supply circuit 640 may comprise any of a large variety of power supply circuit characteristics. For example and without limitation, the power supply circuit 640 may be an independent power supply integrated circuit. The power supply circuit 640 may, for example, comprise discrete active and passive electrical components. The power supply circuit 640 may, for example, comprise one or more linear or non-linear regulators. The power supply circuit 640 may, for example, comprise one or more switching regulator circuits (e.g., circuitry related to buck, boost, buck-boost or charge pump architectures). The power supply circuit 640 may, for example, comprise analog, digital or hybrid circuitry. The power supply circuit 640 may, for example, comprise one or more independently controllable outputs. Accordingly, the scope of various aspects of the present invention should not be limited by characteristics of a particular type of power supply circuit.

The exemplary integrated circuit 620 may comprise a first module 622 that monitors at least one performance characteristic of the first electrical device 610. The first module 622 may also monitor at least one performance characteristic of the second electrical device 615. The first module 622 may, for example and without limitation, share various characteristics with the first module 522 of the exemplary system 500 illustrated in FIG. 5 and discussed previously.

Note that the first module 622 may utilize any of a large variety of known or yet to be developed devices or mechanisms (e.g., performance sensors, detectors, hardware, software, etc.) to monitor performance characteristics. For example and without limitation, the first module 622 may utilize a performance sensor or other circuitry incorporated in the first and/or second electrical devices 610, 615, incorporated in the integrated circuit 620 (e.g., as indicated by item 608) or elsewhere in the system 600 (e.g., as indicated by item 609). Also for example, the first module 622 may communicate performance data with the first and/or second electrical devices 610, 615 and process such performance data to ascertain one or more particular performance characteristics for the first and/or second electrical devices 610, 615. Accordingly, the scope of various aspects of the present invention should not be limited by characteristics of particular devices or methods for monitoring various electrical power characteristics.

The exemplary integrated circuit 620 may comprise a second module 624 with which the first module 622 may communicate information regarding the at least one monitored performance characteristic. The second module 624 may, for example and without limitation, share various characteristics with the exemplary second module 524 illustrated in FIG. 5 and discussed previously.

For example and without limitation, the second module 624 may comprise a power controller module. For example, the second module 624 may process performance characteristic information received from the first module 622 to determine power control information, which may be utilized to control power supply circuitry (e.g., the power supply circuit 640). Various non-limiting aspects of such power control information were presented previously. As discussed previously with regard to the second module 524 of FIG. 5, the second module 624 may process received performance characteristic information to determine power control information in any of a variety of manners.

The second module 624 may, for example, receive information of one or more monitored performance characteristics for a plurality of electrical devices (e.g., the first and second electrical devices 610, 615). The following discussion will refer to monitored performance characteristics for the first and second electrical devices 610, 615. However, it must be noted that the discussion is readily extensible to scenarios involving any number of electrical devices. In processing the received information to determine power supply control information, the second module 624 may process such received information in any of a large variety of ways.

For example and without limitation, the second module 624 may arbitrate between the first electrical device 610 and the second electrical devices 615. Non-limiting illustrative examples of such arbitration were discussed previously. Such arbitration may, for example, comprise considering respective performance goals or needs of the first electrical device 610 and the second electrical device 615. Such arbitration may, for example, comprise considering respective priorities of the first electrical device 610 and the second electrical devices 615. For example, such arbitration may comprise determining power control information in accordance with the performance goals or needs of the highest priority electrical device. Also for example, such arbitration may comprise determining power control information based on a priority-based or need-based weighted average. In general, such arbitration may comprise arbitrating between performance needs of various electrical devices. Accordingly, the scope of various aspects of the present invention should not be limited by characteristics of a particular arbitration scheme.

The third module 626 may receive the power control information determined by the second module 624 and communicate the power control information to another module within the integrated circuit 620 or an electrical device external to the integrated circuit 620. The third module 626 may, for example and without limitation, share various characteristics with the third module 526 illustrated in FIG. 5 and discussed previously.

In the exemplary system 600, the third module 626 communicates the power control information to the power supply circuit 640, discussed previously. The third module 626 may, for example, communicate the power control information with the power supply circuit 640 through the control interface module 646 of the power supply circuit 640.

In an exemplary scenario, the second module 624 may receive information regarding the at least one monitored power characteristic from the first module 622 and process such information to determine a power adjustment request (or command). The third module 624 may then communicate the determined power adjustment request to the power supply circuit 640 to request that the power supply circuit 640 modify various aspects of supplied electrical power. For example, the third module 626 may communicate a power adjustment request through the control interface module 646 to at least one of the first power output module 642 and the second power output module 644 of the power supply circuit 640. The power supply circuit 640 may then, for example, respond to the communicated power adjustment request (or command) by adjusting one or more characteristics of electrical power output from the power supply circuit 640.

The exemplary system 600 illustrated in FIG. 6 and discussed previously is merely exemplary, and was presented to illustrate a non-limiting portion of various aspects of the present invention. Accordingly, the scope of various aspects of the present invention should by no means be limited by characteristics of the exemplary system 600.

Figure 7:
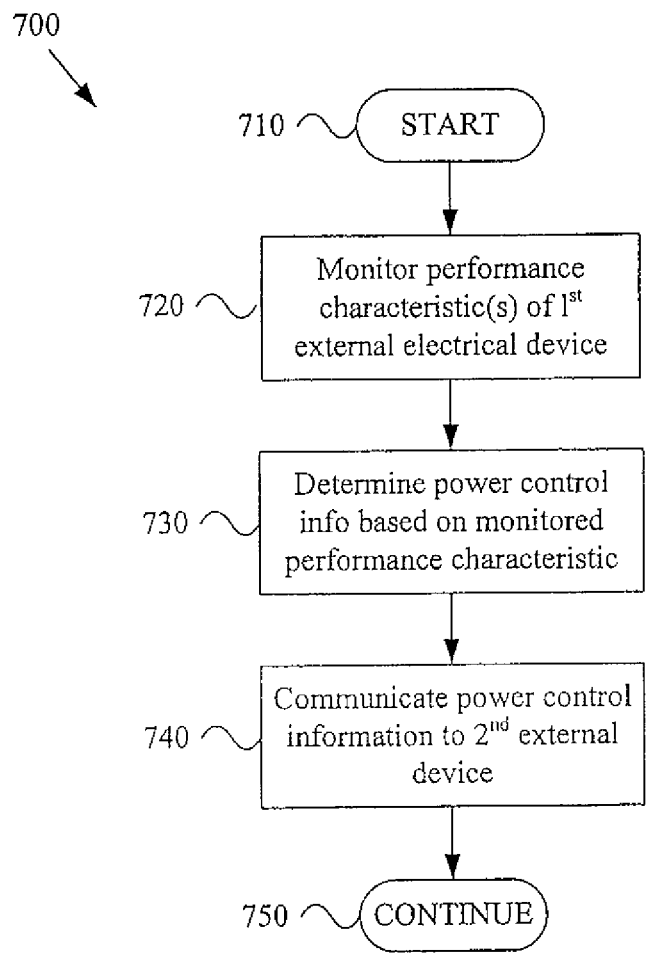
FIG. 7 illustrates an exemplary method for controlling performance, in accordance with various aspects of the present invention.

FIG. 7 illustrates an exemplary method 700 for controlling performance, in accordance with various aspects of the present invention. The exemplary method 700 may, for example and without limitation, share various characteristics with the functionality performed by the exemplary systems 500, 600 illustrated in FIGS. 5 and 6 and discussed previously. The exemplary method may further, for example and without limitation, share various characteristics with the exemplary methods 300, 400 illustrated in FIGS. 3 and 4 and discussed previously.

The exemplary method 700 may, at step 720, comprise monitoring at least one performance characteristic of a first electrical device (for example and without limitation, an electrical device external to the integrated circuit performing the method 700). For example and without limitation, step 720 may share various characteristics with the functionality performed by the first module 522 of the exemplary integrated circuit 520 illustrated in FIG. 5 and discussed previously.

The first electrical device may comprise any of a large variety of circuit characteristics. Accordingly, the scope of various aspects of the present invention should not be limited by characteristics of a particular electrical device or circuit type.

As mentioned previously, monitored performance characteristics of an electrical device may comprise any of a variety of circuit performance characteristics. Accordingly, the scope of various aspects of the present invention should not be limited by any particular circuit performance characteristics.

It should be noted that exemplary step 720 may comprise monitoring one or more performance characteristics for one or more functional aspects of the first electrical device. For example, the first electrical device may perform a plurality of functions, characteristic(s) of which step 720 may comprise monitoring. Accordingly, the scope of various aspects of the present invention should not be limited by a particular number of monitored performance characteristics or number of functional aspects of an electrical device.

Also, step 720 may comprise monitoring at least one performance characteristic of other electrical devices, some of which may be internal or external to the integrated circuit. Accordingly, the scope of various aspects of the present invention should not be limited by a particular number or location of electrical devices for which step 720 may comprise monitoring at least one performance characteristic.

The exemplary method 700 may, at step 730, comprise determining power control information based, at least in part, on the performance characteristics monitored at step 720. Step 730 may, for example and without limitation, share various functional characteristics with the second modules 524, 624 illustrated in FIGS. 5-6 and discussed previously.

For example, step 730 may comprise processing information of performance characteristics monitored at step 720 to determine power control information, which may be utilized to control power supply circuitry. Step 730 may, for example, comprise processing such performance characteristic information to determine power control information in any of a variety of manners.

For example and without limitation, step 730 may comprise comparing information of monitored performance to performance goal information. Step 730 may, for example, comprise determining whether the first external electrical device (and/or other device) is achieving performance goals. Such performance goals may, for example and without limitation, comprise goals related to processing speed, response time, operating temperature, energy consumption, energy-efficiency, error rate, data throughput, etc.

Step 730 may, for example, comprise determining whether a performance adjustment is desired. Step 730 may also, for example, comprise determining how much of a performance adjustment is desired. Such determination(s) may, for example, comprise balancing various performance goals, which may be complementary or adversely related. Step 730 may then, for example, comprise correlating performance or a performance change to various power supply characteristic(s). Step 730 may, for example, comprise determining power control request or command signals to communicate with other circuitry, where the request or command signals are designed to provide for control over one or more power supply characteristics.

In an exemplary scenario, step 730 may comprise processing information of monitored performance characteristics from the first electrical device (e.g., as monitored at step 720) and determining that, while data processing speed is substantially exceeding the minimum goal, energy consumption is in excess of the maximum goal. Step 730 may then, for example, comprise determining that a 2% decrease in power supply voltage level will decrease the energy consumption below the maximum energy consumption goal, while still providing for data processing speed at or above the minimum data processing speed goal. Step 730 may then, for example, comprise determining power control information that, when processed by power supply circuitry, may cause such a 2% decrease in power supply voltage level.

In another exemplary scenario, step 730 may comprise processing information of monitored performance characteristics from the first electrical device (e.g., as monitored at step 720) and determining that, while the communication error rate is substantially below the maximum error rate goal, the operating temperature is above the maximum temperature goal. Step 730 may then, for example, comprise determining that a 1.5% reduction in power supply voltage level will decrease operating temperature below the maximum temperature goal, while still meeting the error rate goal. Step 730 may then, for example, comprise determining power control information that, when processed by power supply circuitry, may cause such a 1.5% reduction in power supply voltage level.

In a further exemplary scenario, step 730 may comprise processing information of monitored performance characteristics from the external electrical device (e.g., as monitored at step 720) and determining that energy-efficiency goals are comfortably being met, while data throughput rate goals are not being met due to power supply voltage instability. Step 730 may then, for example, comprise determining that a 20% increase in power supply switching rate may reduce voltage variations below an acceptable maximum level, while still meeting energy-efficiency goals. Step 730 may then, for example, comprise determining power control information that, when processed by power supply circuitry, may cause such a 20% increase in power supply switching rate.

Step 730 may comprise processing performance characteristic information of one or more monitored performance characteristics for a plurality of electrical devices (e.g., as monitored at step 720). In processing the performance characteristic information to determine power supply control information, step 730 may comprise processing the received information in any of a large variety of ways.

For example and without limitation, step 730 may comprise arbitrating between various electrical devices. Such arbitration may, for example, comprise considering respective performance goals or needs of the plurality of electrical devices. Such arbitration may, for example, comprise considering respective priorities of the plurality of electrical devices. For example, such arbitration may comprise determining power control information in accordance with the performance goals or needs of the highest priority electrical device. Also for example, such arbitration may comprise determining power control information based on a priority-based or need-based weighted average. In general, such arbitration may comprise arbitrating between performance goals or needs of various electrical devices. Accordingly, the scope of various aspects of the present invention should not be limited by characteristics of a particular arbitration scheme.

The exemplary method 700 may, at step 740, comprise communicating at least a portion of the power control information (e.g., as determined at step 730) with a second electrical device (for example and without limitation, a second electrical device that is external to the first integrated circuit and the first electrical device). Step 740 may, for example and without limitation, share various functional characteristics with the third modules 526, 626 illustrated in FIGS. 5-6 and discussed previously.

Such a second electrical device may, for example and without limitation, comprise power managing and/or power supply circuitry. The second electrical device may, for example, provide electrical power to the integrated circuit, first electrical device, or other electrical device(s). Note however, that the second electrical device is not necessarily related to power supply circuitry.

Such power control information may, for example, comprise controlling signals that directly control operation of power supply circuitry. Such power control information may, for example, comprise a power supply request or command, which may be interpreted and processed by power supply circuitry that receives such a request or command. Such power control information may, for example, comprise any of a variety of information related to monitored performance of the first electrical device, other electrical devices, etc. Accordingly, the scope of various aspects of the present invention should not be limited by characteristics of particular power control information or by a particular destination for such power control information.

Step 740 may comprise performing functionality of varying complexity. For example, in a first exemplary scenario, step 740 may comprise performing a plurality of signal processing functions, each of which may comprise performing a signal processing or communicating activity (e.g., A/D conversion, data manipulation, data packaging, one or two-way data communication, etc.). In a second exemplary scenario, step 740 may comprise merely forwarding information determined at step 730 to the second electrical device. Accordingly, the scope of various aspects of the present invention should not be limited by characteristics of particular degrees of processing and/or communication complexity.

In general, step 740 may comprise communicating with a second electrical device (e.g., external to the integrated circuit) regarding the power control information determined at step 730. Accordingly, the scope of various aspects of the present invention should not be limited by characteristics of a particular monitored performance characteristic or a particular type of information that may be determined from a monitored performance characteristic.

Figure 8:
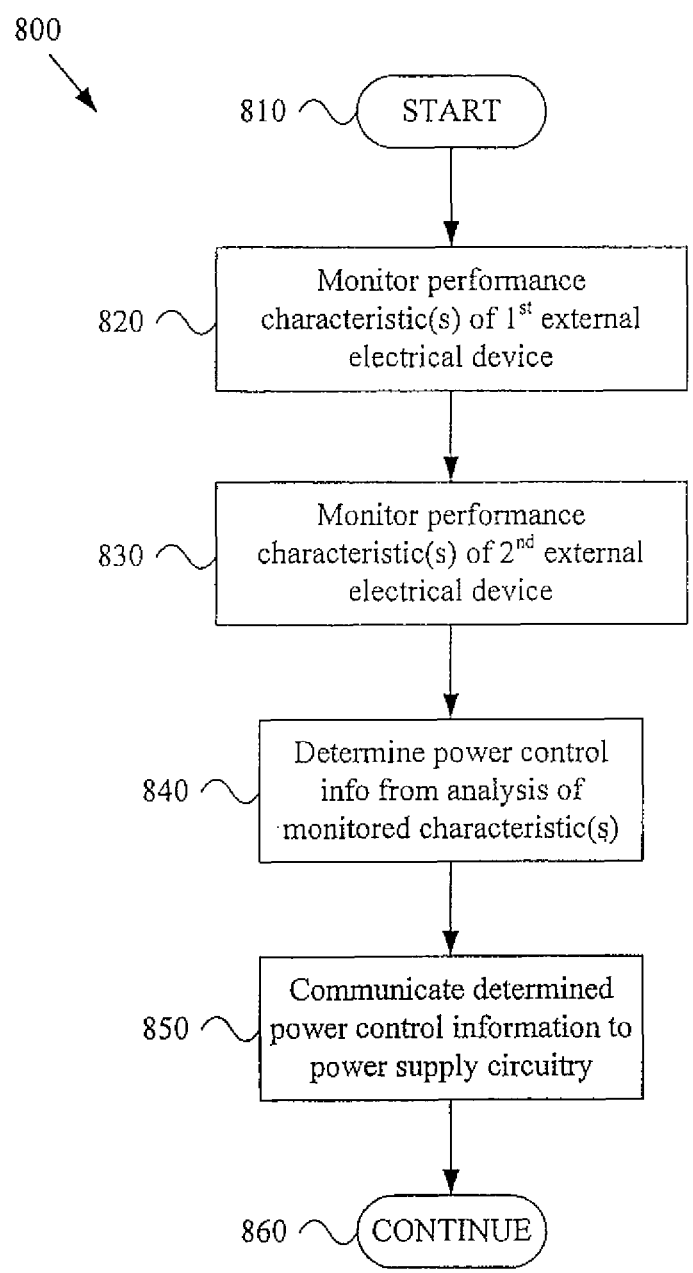
FIG. 8 illustrates an exemplary method for controlling power, in accordance with various aspects of the present invention.

FIG. 8 illustrates an exemplary method 800 for controlling power, in accordance with various aspects of the present invention. The exemplary method 800 may, for example and without limitation, share various characteristics with the exemplary method 700 illustrated in FIG. 7 and discussed previously. Further for example, the exemplary method 800 may share various characteristics with functionality discussed previously with regard to the exemplary systems 500, 600 illustrated in FIGS. 5-6 and discussed previously.

The exemplary method 800 may, at step 820, comprise monitoring at least one performance characteristic of a first electrical device (for example and without limitation, an electrical device external to the integrated circuit performing the method 800). For example and without limitation, step 820 may share various characteristics with step 820 of the exemplary method 700 illustrated in FIG. 7 and discussed previously. Also for example, step 720 may share various characteristics with the functionality performed by the first modules 522, 622 illustrated in FIGS. 5-6 and discussed previously.

The exemplary method 800 may, at step 830, comprise monitoring at least one performance characteristic of a second electrical device (for example and without limitation, an electrical device external to the integrated circuit performing the method 800). For example and without limitation, step 830 may share various characteristics with step 820, albeit with regard to a second electrical device rather than the first electrical device.

The exemplary method 800 may, at step 840, comprise determining power control information from an analysis of performance characteristic(s) monitored at steps 820 and 830. For example and without limitation, step 840 may share various characteristics with step 730 of the exemplary method 700 illustrated in FIG. 7 and discussed previously. Also for example, step 840 may share various characteristics with the functionality discussed previously with regard to the second modules 524, 624 of the exemplary systems 500, 600 illustrated in FIGS. 5-6 and discussed previously.

Such power control information may, for example, comprise controlling signals that directly control operation of power supply circuitry. Such power control information may, for example, comprise a power supply request or command, which may be interpreted and processed by power supply circuitry that receives such a request or command. Such power control information may, for example, comprise any of a variety of information types related to performance characteristics monitored at steps 820 and 830. Accordingly, the scope of various aspects of the present invention should not be limited by characteristics of particular power control information.

Step 840 may comprise determining power control information by analyzing the performance characteristics monitored at steps 820 and 830 in any of a variety of ways. For example and without limitation, step 840 may comprise arbitrating between various electrical devices (e.g., the first and second electrical devices). Such arbitration may, for example, comprise considering respective performance goals or needs of the plurality of electrical devices. Such arbitration may, for example, comprise considering respective priorities of the electrical devices. For example, such arbitration may comprise determining power control information in accordance with the performance goals or needs of the highest priority electrical device. Also for example, such arbitration may comprise determining power control information based on a priority-based or need-based weighted average.

In an exemplary scenario, step 840 may comprise processing information regarding performance characteristics of a first electrical device (e.g., as monitored at step 820) and information regarding performance characteristics of a second electrical device (e.g., as monitored at step 830). Step 840 may, in the exemplary scenario, comprise determining that the performance goals or needs of the first electrical device outweigh the performance goals or needs of the second electrical device, and determining power supply control information based on the performance goals or needs of the first electrical device and the information regarding performance characteristics of the first electrical device.

In another exemplary scenario, step 840 may comprise processing information regarding performance characteristics of a first electrical device (e.g., as monitored at step 820) and information regarding performance characteristics of a second electrical device (e.g., as monitored at step 830). Step 840 may, in the exemplary scenario, comprise determining that the performance goals or needs of the first electrical device are equal to the performance goals or needs of the second electrical device, and determining power supply control information based equally on the performance goals or needs of the first electrical device and associated information regarding performance characteristics of the first electrical device, and with the performance goals or needs of the second electrical device and associated information regarding performance characteristics of the second electrical device.

In still another exemplary scenario, step 840 may comprise processing information regarding performance characteristics of a first electrical device (e.g., as monitored at step 820) and information regarding performance characteristics of a second electrical device (e.g., as monitored at step 830). Step 840 may, in the exemplary scenario, comprise determining that the performance goals or needs of the first electrical device are prioritized higher than the performance goals or needs of the second electrical device, and determining power supply control information based on a priority-based weighted average of the performance goals or needs of the first electrical device and associated information regarding performance characteristics of the first electrical device, and the performance goals or needs of the second electrical device and associated information regarding performance characteristics of the second electrical device.

In general, exemplary step 840 may comprise determining power control information from an analysis of performance characteristics monitored at steps 820 and 830. Accordingly, the scope of various aspects of the present invention should not be limited by characteristics of a particular analysis or determination of power control information.

The exemplary method 800 may, at step 850, comprise communicating the power control information (e.g., as determined at step 840) to power supply circuitry that provides the electrical power to the first and second electrical devices. For example and without limitation, step 850 may share various characteristics with step 740 of the exemplary method 700 illustrated in FIG. 7 and discussed previously. Also for example, step 850 may share various characteristics with functionality performed by the third modules 526, 626 of the exemplary systems 500, 600 illustrated in FIGS. 5-6 and discussed previously.

The exemplary method 800 discussed above presents an exemplary illustration comprising monitoring characteristics of received electrical power at first and second electrical devices and determining power control information based, at least in part, on such monitored performance characteristics. It should be noted that various aspects of the exemplary illustration are readily extensible to systems comprising any number of electrical devices. Accordingly, the scope of various aspects of the present invention should not be limited to a particular number of electrical devices for which performance characteristics of received electrical power may be monitored and utilized to determine power control information.

The previous discussion has presented exemplary illustrations of various aspects of the present invention. At various times, the previous discussion has referred to circuits, electrical devices, modules and integrated circuits. Such terms may often be interchangeable. It should be noted that various aspects of the present invention may be performed by hardware, a processor executing software instructions, or a combination thereof. Further, various aspects of the present invention may be performed by local modules or sub-systems or by a distributed network of modules or sub-systems. For example, various aspects of the present invention may be performed by modules integrated into a single integrated circuit or by a set of integrated circuits. Accordingly, the scope of various aspects of the present invention should not be limited by characteristics of any particular implementation.

In summary, various aspects of the present invention provide a system and method for controlling electrical power and/or performance based on monitored performance characteristics. While the invention has been described with reference to certain aspects and embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A power control system, comprising:
   a performance monitoring module configured to monitor a performance characteristic of a first integrated circuit;
   in a first operating mode, said performance monitoring module is configured to determine power control information based on said performance characteristic of said first integrated circuit and a reduced power mode; and
   in a second operating mode, said performance monitoring module is configured to determine further power control information based on said performance characteristic of said first integrated circuit and a further reduced power mode.

2. The power control system of claim 1, wherein said power control information and said further power control information are communicated with another module.

3. The power control system of claim 2, wherein said other module performs a power control function.

4. The power control system of claim 1, wherein said first integrated circuit is configured to operate in said reduced power mode.

5. The power control system of claim 1, wherein said first integrated circuit is configured to not operate in said further reduced power mode.

6. The power control system of claim 1, wherein in said first operating mode, said performance monitoring module is configured to determine said power control information by balancing between a plurality of different performance goals.

7. The power control system of claim 1, wherein in said first operating mode, said performance monitoring module is configured to determine said power control information by arbitrating between a plurality of different modules of said first integrated circuit and a second integrated circuit.

8. The power control system of claim 1, wherein in said first operating mode, said performance monitoring module is configured to arbitrate between a plurality of different modules of said first integrated circuit and a second integrated circuit based on respective priorities of said plurality of different modules.

9. The power control system of claim 1, wherein in said first operating mode, said performance monitoring module is configured to arbitrate between a plurality of different modules of said first integrated circuit and a second integrated circuit based on a priority-based weighted average.

10. The power control system of claim 1, wherein said performance characteristic comprises processing speed.

11. The power control system of claim 1, wherein said performance characteristic comprises temperature.

12. The power control system of claim 1, wherein said performance characteristic comprises error rate.

13. The power control system of claim 1, wherein said performance characteristic comprises one or both of energy consumption and energy efficiency.

14. The power control system of claim 1, further comprising a performance sensor that said performance monitoring module is configured to utilize to monitor said performance characteristic.

15. The power control system of claim 1, wherein said power control information comprises power adjustment information related to a change in said performance characteristic.

16. The power control system of claim 1, wherein said further power control information comprises power adjustment information related to a change in said performance characteristic.

17. A method, comprising:
   monitoring a performance characteristic of a first integrated circuit in a system;
   determining power control information based on said performance characteristic of said first integrated circuit and a first performance goal in a first operating mode;
   determining further power control information based on said performance characteristic of said first integrated circuit and a second performance goal in a second operating mode; and
   communicating said power control information and said further power control information with another module in said system.

18. The method of claim 17, wherein said first performance goal is for said system to operate in a reduced power mode.

19. The method of claim 18, wherein said second performance goal is for said system to operate in a further reduced power mode.

20. The method of claim 19, wherein said first integrated circuit does not operate in said further reduced power mode.

21. The method of claim 17, wherein said power control information comprises a power supply voltage level reduction.

22. A power control system, comprising:
- a performance monitoring module configured to monitor a performance characteristic of a first integrated circuit;
- a first performance sensor that said performance monitoring module is configured to utilize to monitor said performance characteristic; and
- a second performance sensor utilized by said performance monitoring module,
- wherein said first integrated circuit comprises said first performance sensor, and wherein an electrical device, different from said first integrated circuit, comprises said second performance sensor,
- wherein, in a first operating mode, said performance monitoring module is configured to determine power control information based on said performance characteristic of said first integrated circuit and a reduced power mode, and
- wherein, in a second operating mode, said performance monitoring module is configured to determine further power control information based on said performance characteristic of said first integrated circuit and a further reduced power mode.

23. The power control system of claim 22, wherein said performance monitoring module is further configured to use said second performance sensor to monitor a second performance characteristic of said electrical device.

* * * * *